US011061081B2

(12) United States Patent
Maguire

(10) Patent No.: US 11,061,081 B2
(45) Date of Patent: Jul. 13, 2021

(54) WEARABLE AUDIO DEVICE

(71) Applicant: Bose Corporation, Framingham, MA (US)

(72) Inventor: Stephen J. Maguire, Grafton, MA (US)

(73) Assignee: Bose Corporation, Framingham, MA (US)

(*) Notice: Subject to any disclaimer, the term of this patent is extended or adjusted under 35 U.S.C. 154(b) by 150 days.

(21) Appl. No.: 16/360,420

(22) Filed: Mar. 21, 2019

(65) Prior Publication Data
US 2020/0300932 A1 Sep. 24, 2020

(51) Int. Cl.
G01R 33/028 (2006.01)
G01R 33/00 (2006.01)
H04R 1/10 (2006.01)
H04S 7/00 (2006.01)

(52) U.S. Cl.
CPC ....... *G01R 33/028* (2013.01); *G01R 33/0094* (2013.01); *H04R 1/1016* (2013.01); *H04S 7/304* (2013.01)

(58) Field of Classification Search
CPC .............. G01R 33/028; G01R 33/0094; G01R 33/0076; G01R 33/02; G01R 33/0017; H04R 1/1016; H04R 2209/022; H04R 1/1041; H04S 7/304
USPC ...................................................... 324/244
See application file for complete search history.

(56) References Cited

U.S. PATENT DOCUMENTS

| 5,126,669 | A | | 6/1992 | Honess et al. |
| 5,991,085 | A | * | 11/1999 | Rallison ............... G02B 27/017 345/8 |
| 9,141,194 | B1 | | 9/2015 | Keyes et al. |
| 9,369,791 | B2 | | 6/2016 | Tanaka |
| 9,854,345 | B2 | | 12/2017 | Briggs |
| 9,883,280 | B2 | | 1/2018 | Oosato et al. |
| 9,996,162 | B2 | * | 6/2018 | Kar ......................... G06F 3/011 |
| 10,212,507 | B1 | * | 2/2019 | Maguire .............. H04R 1/1016 |
| 10,516,929 | B2 | * | 12/2019 | Maguire ........... G01R 33/0017 |
| 10,575,107 | B2 | * | 2/2020 | So ......................... H04R 25/65 |

(Continued)

FOREIGN PATENT DOCUMENTS

| EP | 2645750 A1 | 10/2013 |
| WO | 2013155217 A1 | 10/2013 |

OTHER PUBLICATIONS

The International Search Report and the Written Opinion of the International Searching Authority dated Jul. 4, 2019 for PCT Application No. PCT/US2019/020914.

(Continued)

*Primary Examiner* — Christopher P McAndrew
(74) *Attorney, Agent, or Firm* — Brian M. Dingman; Dingman IP Law, PC

(57) ABSTRACT

A wearable audio device with a magnetic field sensor that is constructed and arranged to sense the Earth's magnetic field. A magnet in the earphone, for example the magnet of the electro-acoustic transducer, produces a first magnetic field having a first magnetic field strength. A nulling magnet produces a nulling magnetic field along at least a first nulling magnet axis. The nulling magnet is configured to reduce an influence of the first magnetic field on the magnetic field sensor. The first nulling magnet axis, the first magnet axis, and the first sense axis are aligned.

16 Claims, 5 Drawing Sheets

(56) References Cited

U.S. PATENT DOCUMENTS

| | | | |
|---|---|---|---|
| 10,841,716 B2* | 11/2020 | Perri | H04R 25/554 |
| 2005/0092919 A1 | 5/2005 | Bellec et al. | |
| 2005/0111673 A1 | 5/2005 | Rosen et al. | |
| 2006/0018075 A1 | 1/2006 | Schultz | |
| 2006/0034478 A1 | 2/2006 | Davenport | |
| 2007/0092093 A1 | 4/2007 | Shim | |
| 2009/0296947 A1* | 12/2009 | Duron | H04R 25/554 |
| | | | 381/71.6 |
| 2011/0044485 A1* | 2/2011 | Lin | H04R 25/604 |
| | | | 381/322 |
| 2011/0206225 A1* | 8/2011 | Moller | H04R 25/556 |
| | | | 381/314 |
| 2011/0273169 A1 | 11/2011 | LaCroix | |
| 2011/0291497 A1 | 12/2011 | Choi | |
| 2012/0219166 A1 | 8/2012 | Ball | |
| 2013/0272563 A1 | 10/2013 | Boyd | |
| 2013/0329910 A1 | 12/2013 | Crosby et al. | |
| 2015/0003662 A1 | 1/2015 | Vernon et al. | |
| 2015/0181355 A1 | 6/2015 | Pedersen | |
| 2015/0195639 A1 | 7/2015 | Azmi et al. | |
| 2015/0281852 A1* | 10/2015 | Sacha | H04R 25/00 |
| | | | 381/331 |
| 2015/0326963 A1 | 11/2015 | Sorensen et al. | |
| 2015/0365755 A1 | 12/2015 | Harper | |
| 2017/0014071 A1 | 1/2017 | Readdie et al. | |
| 2017/0090003 A1 | 3/2017 | Guo | |
| 2017/0093079 A1 | 3/2017 | Wagman et al. | |
| 2017/0160086 A1 | 6/2017 | Kesaniemi | |
| 2017/0208382 A1 | 7/2017 | Grinker | |
| 2017/0295443 A1 | 10/2017 | Boesen | |
| 2018/0070166 A1* | 3/2018 | Howell | H04R 1/1016 |
| 2018/0088185 A1 | 3/2018 | Woods et al. | |
| 2018/0096770 A1 | 4/2018 | Danielson et al. | |
| 2018/0115816 A1 | 4/2018 | Panecki et al. | |
| 2018/0115839 A1* | 4/2018 | Eichfeld | H04R 5/027 |
| 2018/0193728 A1 | 7/2018 | Bashkirov et al. | |
| 2018/0211751 A1 | 7/2018 | Khoshkava et al. | |
| 2019/0281376 A1* | 9/2019 | Maguire | H04R 1/028 |
| 2019/0281377 A1 | 9/2019 | Maguire et al. | |
| 2020/0280788 A1* | 9/2020 | Maguire | H04R 1/1041 |
| 2020/0292633 A1* | 9/2020 | Maguire | G01R 33/0206 |
| 2020/0300932 A1* | 9/2020 | Maguire | G01R 33/0076 |
| 2020/0304895 A1* | 9/2020 | Maguire | H04R 1/1041 |

OTHER PUBLICATIONS

U.S. Appl. No. 62/626,967, filed Feb. 6, 2018; Applicant: Bose Corporation.
The International Search Report and the Written Opinion of the International Searching Authority dated Jun. 29, 2020 for PCT Application No. PCT/US2020/023485.

* cited by examiner

WEARABLE AUDIO DEVICE

BACKGROUND

This disclosure relates to a wearable audio device such as an earphone.

Wearable audio devices (e.g., earbuds or headphones) can include orientation tracking systems that use a magnetometer to track motions of the head and the direction in which the wearer is looking. Magnetometers need to accurately detect the Earth's magnetic field. The wearable audio device's electro-acoustic transducer typically includes a magnet. The wearable audio device can also include a magnet used to dock or park the wearable audio device to another structure. Since some wearable audio devices, such as in-ear headphones (sometimes also called earbuds) are desirably quite small, of necessity the magnetometer is close to the other magnets. The magnetic field of the other magnets may have a magnetic field strength that is much greater than the Earth's magnetic field. Accordingly, the magnetic fields can overwhelm the magnetometer and prevent it from working properly.

SUMMARY

All examples and features mentioned below can be combined in any technically possible way.

In one aspect, a wearable audio device includes a magnetic field sensor that is constructed and arranged to sense the Earth's magnetic field along at least a first sense axis, a first magnet that produces a first magnetic field along at least a first magnet axis, and a nulling magnet that produces a nulling magnetic field along at least a first nulling magnet axis, wherein the nulling magnet is configured to reduce an influence of the first magnetic field on the magnetic field sensor. The first nulling magnet axis, the first magnet axis, and the first sense axis may all be aligned.

Examples may include one of the above and/or below features, or any combination thereof. The magnetic field sensor, the first magnet, and the nulling magnet may be positioned along a common axis. The magnetic field sensor may comprise a magnetometer. The magnetic field sensor may comprise a multiple-axis magnetometer that is constructed and arranged to sense the Earth's magnetic field along at least first and second mutually orthogonal sense axes. The first magnetic field may have first and second mutually orthogonal first magnet axes and the nulling magnetic field may have first and second mutually orthogonal nulling magnet axes. The first nulling magnet axis, the first magnet axis, and the first sense axis may be coaxial. The second nulling magnet axis, the second first magnet axis, and the second sense axis may be coaxial. The nulling magnet may comprise a permanent magnet.

Examples may include one of the above and/or below features, or any combination thereof. The first magnet may comprise a transducer magnet of an electro-acoustic transducer that is adapted to create an audio output. The wearable audio device may further comprise a housing that is constructed and arranged to direct the audio output at the ear canal of the ear. The nulling magnet may be positioned in the housing such that the nulling magnetic field reduces the strength of the transducer magnetic field at the magnetic field sensor.

Examples may include one of the above and/or below features, or any combination thereof. The wearable audio device may comprise an earbud with an earbud body, and the magnetic field sensor, the first magnet, and the nulling magnet may all be located in the earbud body. The magnetic field sensor may have a sensed magnetic field range where it operates linearly, and the nulling magnetic field may reduce the strength of the first magnetic field at the magnetic field sensor such that the sensed magnetic field strength is in the sensed magnetic field range where the magnetic field sensor operates linearly. The first magnetic field may have a direction along the first magnet axis, and the nulling magnetic field may have the same or an opposite direction along the first nulling magnet axis.

In another aspect, a wearable audio device includes a housing that is configured to be located at least in part in an ear of a user, an electro-acoustic transducer in the housing for creating audio output that is provided to an ear canal of the user, the electro-acoustic transducer comprising a transducer magnet that produces a transducer magnetic field having a transducer magnetic field strength along at least a first transducer magnet axis, and a magnetometer in the housing and that is constructed and arranged to sense the Earth's magnetic field along at least a first sense axis. The first transducer magnet axis and the first sense axis may be aligned.

Examples may include one of the above and/or below features, or any combination thereof. The magnetometer may have a sensed magnetic field range where it operates linearly, and the transducer magnetic field at the magnetometer may have a strength such that the sensed magnetic field strength is in the sensed magnetic field range where the magnetometer operates linearly. The wearable audio device may further include a nulling magnet in the housing and that is constructed and arranged to produce a nulling magnetic field along at least a first nulling magnet axis, wherein the nulling magnet is configured to reduce the strength of the transducer magnetic field along the first transducer magnet axis at the magnetometer, and wherein the first nulling magnet axis is aligned with the first transducer magnet axis and the first sense axis. The magnetometer may be constructed and arranged to sense the Earth's magnetic field along at least first and second mutually orthogonal sense axes. The transducer magnetic field may have first and second mutually orthogonal first transducer axes. The nulling magnetic field may have first and second mutually orthogonal nulling magnet axes. The second nulling magnet axis, the second transducer magnet axis, and the second sense axis may be aligned. The transducer magnetic field may have a direction along the transducer magnet axis, and the nulling magnetic field may have the same or an opposite direction along the first nulling magnet axis.

In another aspect, a wearable audio device includes a body that is constructed and arranged to be positioned at or near an ear of a user, a multiple-axis magnetometer in the body that is constructed and arranged to sense the Earth's magnetic field along at least first and second mutually orthogonal sense axes, a transducer magnet of an electro-acoustic transducer in the body that is adapted to create an audio output that is directed towards the ear of the user, wherein the transducer magnet produces a transducer magnetic field along at least first and second mutually orthogonal transducer magnet axes, and a nulling magnet in the earbud body that produces a nulling magnetic field along at least first and second mutually orthogonal nulling magnet axes, wherein the nulling magnet is configured to reduce an influence of the transducer magnetic field on the magnetometer. The first nulling magnet axis, the first transducer magnet axis, and the first sense axis may be aligned, and the second nulling magnet axis, the second transducer magnet axis, and the second sense axis may be aligned.

DETAILED DESCRIPTION

Wearable audio devices (one non-limiting example being earphones) can include a transducer magnet, and can also include one or both of a docking magnet and a parking magnet. Wearable audio devices many times include other magnetic devices, for example a magnetometer, ferrite cores (which may be used in filters, for example), and magnetic reed switches, to name only several of many possible magnetic devices in a wearable audio device such as an earbud. These magnetic devices are typically designed to operate without substantial interference from stray magnetic fields. Magnetic devices typically operate in a stable operational range only if the strength of any stray magnetic field is relatively low. The magnets of a wearable audio device (e.g., the transducer magnet, the docking magnet, and/or the parking magnet) can emit stray magnetic fields that can negatively impact the operation of other magnetic devices of the wearable audio device.

When wearable audio devices (e.g., earphones) include a magnetometer, the magnetometer can be located close to the transducer magnet and/or other magnets. The magnetic field from any one or more of these magnets can overwhelm the magnetometer and prevent it from properly detecting the strength of the Earth's magnetic field.

Negative effects on a magnetic device of a wearable audio device due to stray magnetic fields at the location of the magnetic device can be reduced with an additional nulling magnet that has a magnetic field that partially or fully nulls the stray magnetic field(s) at the location of the magnetic device. For example, when the magnetic device is a magnetometer, one or more nulling magnets can be used to bring the magnetometer into a stable region of operation, where the magnetometer can operate in its operational region where stray magnetic fields do not overwhelm the Earth's magnetic field. Any nulling should be sufficient such that the magnetic device can operate in its operational region where stray magnetic fields do not overwhelm it. If the transducer magnet, the nulling magnet, and the magnetometer are aligned along an alignment axis (i.e., they are coaxial), and the magnetic field direction and strength of the nulling magnet is appropriate, the transducer magnetic field at the magnetometer can be reduced or nulled in all three orthogonal axes or dimensions.

Figure 1:
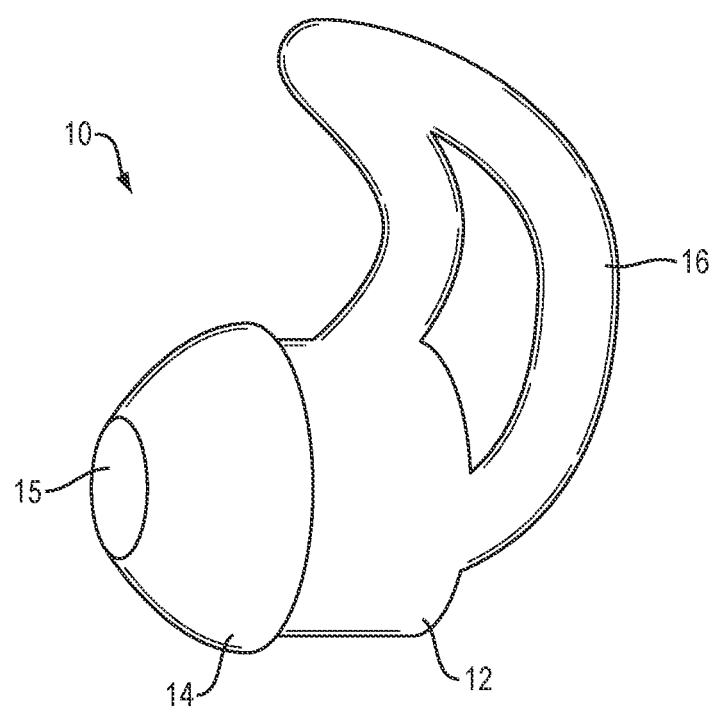
FIG. 1 is perspective view of an earphone.

FIG. 1 is a perspective view of a wireless in-ear headphone, earphone, or earbud, 10. An earphone is only one non-limiting example of the subject wearable audio device. Other examples are described elsewhere herein. Earphone/earbud 10 includes body or housing 12 that houses the active components of the earbud. Portion 14 is coupled to body 12 and is pliable so that it can be inserted into the entrance of the ear canal. Sound is delivered through opening 15. Retaining loop 16 is constructed and arranged to be positioned in the outer ear, for example in the antihelix, to help retain the earbud in the ear. Earbuds are well known in the field (e.g., as disclosed in U.S. Pat. No. 9,854,345, the disclosure of which is incorporated herein by reference for all purposes), and so certain details of the earbud are not further described herein. An earbud 10 is an example of a wearable audio device according to this disclosure, but is not limiting of the scope of this disclosure as stray magnetic fields from one or more magnets at the location of a magnetic device in other types of wearable audio devices can be resolved in accordance with the present disclosure.

Figure 2:
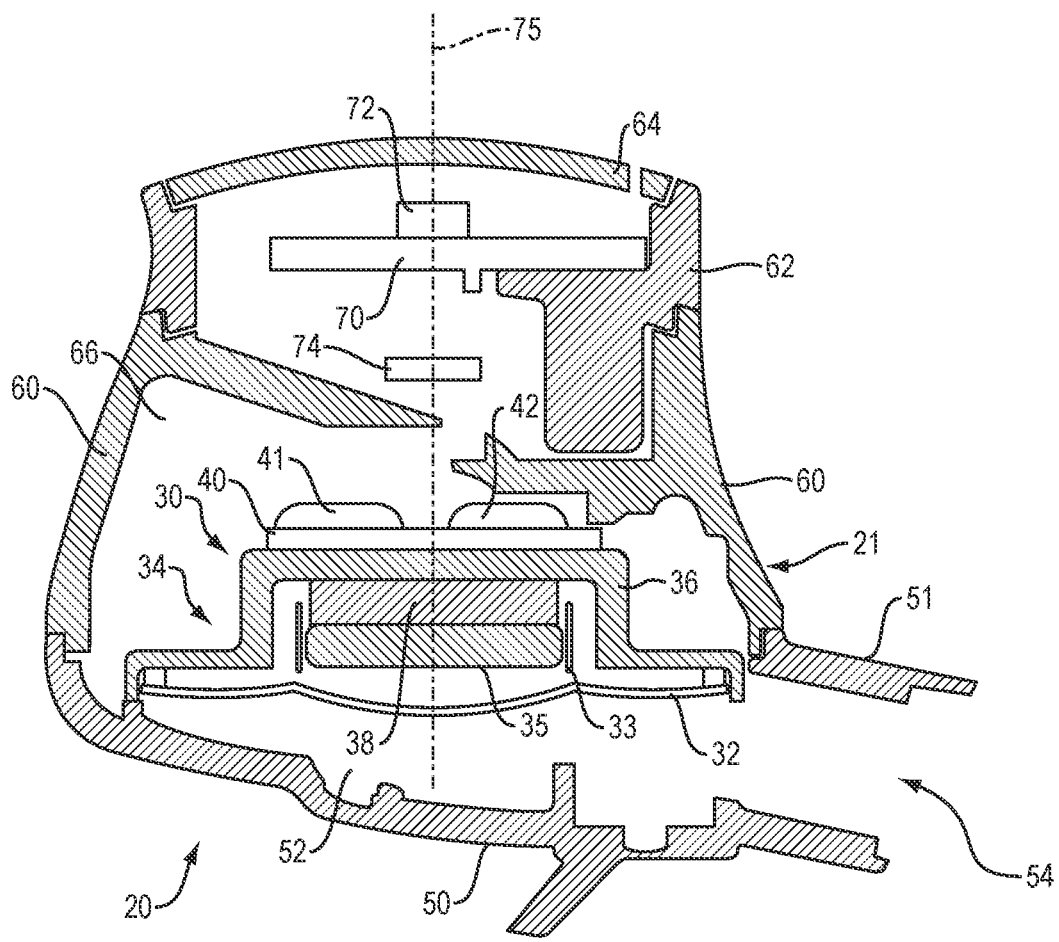
FIG. 2 is a partial cross-sectional view of elements of an earphone.

FIG. 2 is a partial cross-sectional view of only certain elements of an earphone 20 that are useful to a better understanding of the present disclosure. Earphone 20 comprises housing 21 that encloses electro-acoustic transducer 30. Housing 21 comprises front housing portion 50 and rear housing portions 60 and 62. Transducer 30 has diaphragm 32 that is driven in order to create sound pressure in front acoustic cavity 52. Sound pressure is directed out of front housing portion 50 via opening 54. When earphone 20 is an earbud, as shown by earbud 10 in FIG. 1, there is typically a pliable tip (not shown) that is engaged with neck 51 of housing portion 50, to help direct the sound into the ear canal and to seal to the ear canal opening. Earphone housing 21 further comprises a rear enclosure made from rear housing portions 60 and 62, and grille 64. Note that the details of earphone 20 are exemplary of aspects of earphones and are not limiting of the scope of this disclosure, as the present magnetic field reduction at the location of the magnetometer or other magnetic device can be used in varied types and designs of earphones and other wearable audio devices.

Transducer 30 further comprises magnetic structure 34. Magnetic structure 34 comprises transducer magnet 38 and magnetic material that functions to confine and guide the magnetic field from magnet 38, so that the field properly interacts with coil 33 to drive diaphragm 32, as is well known in the electro-acoustic transducer field. The magnetic material comprises cup 36 and front plate 35, both of which are preferably made from a material with relatively high magnetic susceptibility, also as is known in the field. Transducer printed circuit board (PCB) 40 carries electrical and electronic components (not shown) that are involved in driving the transducer. Pads 41 and 42 are locations where wires (not shown) can be coupled to PCB 40.

Three-axis magnetometer 72 is mounted on PCB 70 and is arranged to sense the strength of magnetic fields in three axes at the location of the magnetometer, as is known in the field. Magnetometer 72 is configured to detect the Earth's magnetic field. The output of magnetometer 72 can be used to determine the direction in which the wearer's head is pointed, as described in U.S. Patent Application 62/626,967, filed on Feb. 6, 2018, the entire disclosure of which is incorporated herein by reference. As discussed above, earphone 20 may additionally or alternatively include other magnetic devices that might be adversely impacted by the stray magnetic field from a transducer, coupling, docking, and/or parking magnet.

Since magnetometer 72 is relatively close to transducer magnet 38, the transducer's magnetic field can overwhelm the magnetometer and prevent it from properly detecting the strength of the Earth's magnetic field. The magnetometer can be brought into its specified measurement range (where stray magnetic fields do not overwhelm or skew the desired measurement) with an additional nulling magnet. Nulling magnet 74 is in this non-limiting example located inside of housing 21. It should be understood that a nulling magnet can generally be located inside of or at the surface of earphone housing 21 at a location where it can act to reduce or null field(s) from other magnet(s) that might overwhelm the magnetometer. Magnet 74 can have other functions, such as being used to park the earphone to another structure, or to couple the earphone to a battery charger. In any case, magnet 74 can generally be located inside of or at the inside surface of housing 21 at a location where it can act to perform its described functions. Magnet 74 can be located between transducer magnet 38 and sensor 72, or not.

Magnet 74 is located such that its magnetic field partially or fully nulls the transducer magnetic field at the location of magnetometer 72. This transducer magnetic field nulling should take place in any one, two, or three of the three orthogonal sense axes in which stable operation of the magnetometer is needed. In the present case, stable magnetometer results are desired in all three axes, so magnet 74 is desirably configured to sufficiently null the Earth's magnetic field in all three axes. It should be understood that the location of nulling magnet 74 in FIG. 2 is representative, and magnet 74 may actually be located elsewhere in housing 21 of the wearable audio device, either between the transducer and the magnetometer or on the opposite side of the magnetometer from the transducer. It should also be understood that magnet 74 could be a permanent magnet or an electromagnet, it being necessary only to properly size, place and orient a nulling magnetic field, as described elsewhere herein. The nulling should be sufficient such that magnetometer 72 can operate in at least one sense axis in its operational region where stray magnetic fields do not overwhelm the Earth's magnetic field. Linear operation of magnetometers (where there are stray magnetic fields that are not so strong that they overwhelm sensing or detection of the desired field) is known in the technical field, and so is not further described herein.

Advantageously, in this example, transducer magnet 38, magnetometer 72, and nulling magnet 74, are all located on and symmetric with respect to axis 75. The magnetic fields of magnets 38 and 74 can superimpose at the location of magnetometer 72 and so may provide partial or full self-cancellation along two of the three orthogonal sense axes. The properties of and location of nulling magnet 74 can be selected such that the superimposed fields on the remaining orthogonal axis cancel at magnetometer 72. Alternatively, rather than fully canceling or reducing the field along all three orthogonal sense axes, the nulling magnet can reduce the magnitude of the transducer magnet's field at magnetometer 72 along only one orthogonal axis, or along two orthogonal axes, ideally to the point where the magnetometer can properly detect the Earth's magnetic field.

The necessary properties of (e.g., the size, magnetic field strength and magnetic field orientation), and the location, of nulling magnet 74 can be determined in one non-limiting example as follows. Magnetic fields have both a direction and magnitude. Once the direction and magnitude of the field from transducer magnet 38 (and any other magnets that may have an effect on the magnetometer) at the magnetometer are known, a nulling magnet can be chosen and its location and magnetic orientation determined such that (at the necessary location(s) of the magnetometer where the fields in each axis are sensed) its field in all three axes (x, y, and z) is coaxial with and matches the magnitude of the stray field, and has an opposite direction. If the alignment of the fields and the matching of magnitudes of the fields is proper, and the directions are opposite, the fields will cancel, resulting in the nulling of the stray field(s) at the magnetometer. Full magnetic field cancellation can be very difficult to achieve. An alternative is to reduce the field sufficiently such that the magnetometer operates in its normal range. Since the two magnets and the sensor are aligned, nominally the fields from the transducer magnet and the nulling magnet should be self-cancelling in two of the three axes, and thus the nulling magnet need be configured only to cancel or reduce stray magnetic field in a single axis. Direction of the nulling magnet field is determined based on the orientation of the N-S poles. The magnitude of the nulling magnet field can be established based at least on one or more of the nulling magnet's magnetization, material, shape, size, and location.

In cases where the transducer magnet and the magnetometer are aligned along an axis (and so the fields can at least partially self-cancel), and they are sufficiently far apart, in some situations the remainder of the transducer magnet's field that still reaches the magnetometer may be sufficiently weak that the magnetometer can operate in its stable region of operation without the need for a nulling magnet. In larger form factors of wearable audio devices, such as around-ear or over-ear headsets, the magnetometer and transducer can be far enough away from each other to obviate the need for a separate nulling magnet.

Figure 3:
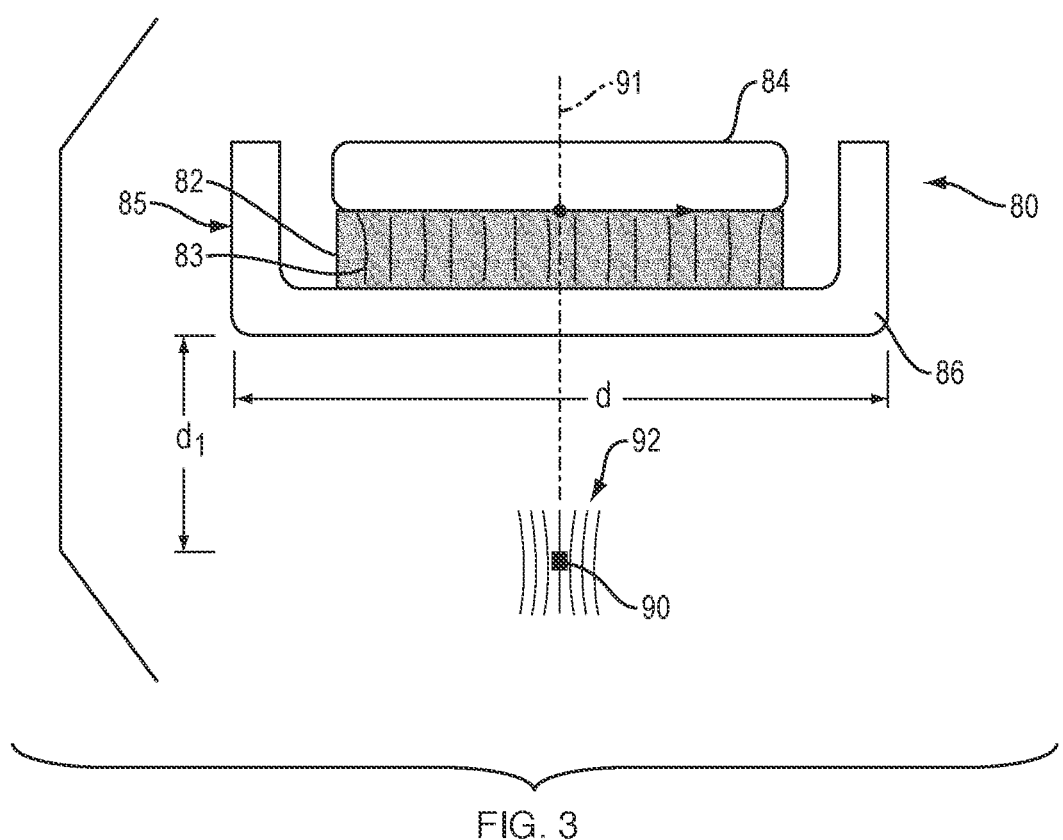
FIG. 3 is a schematic view of the magnetic structure of an earphone and its magnetic field at the location of a magnetic field sensor.
Figure 4:
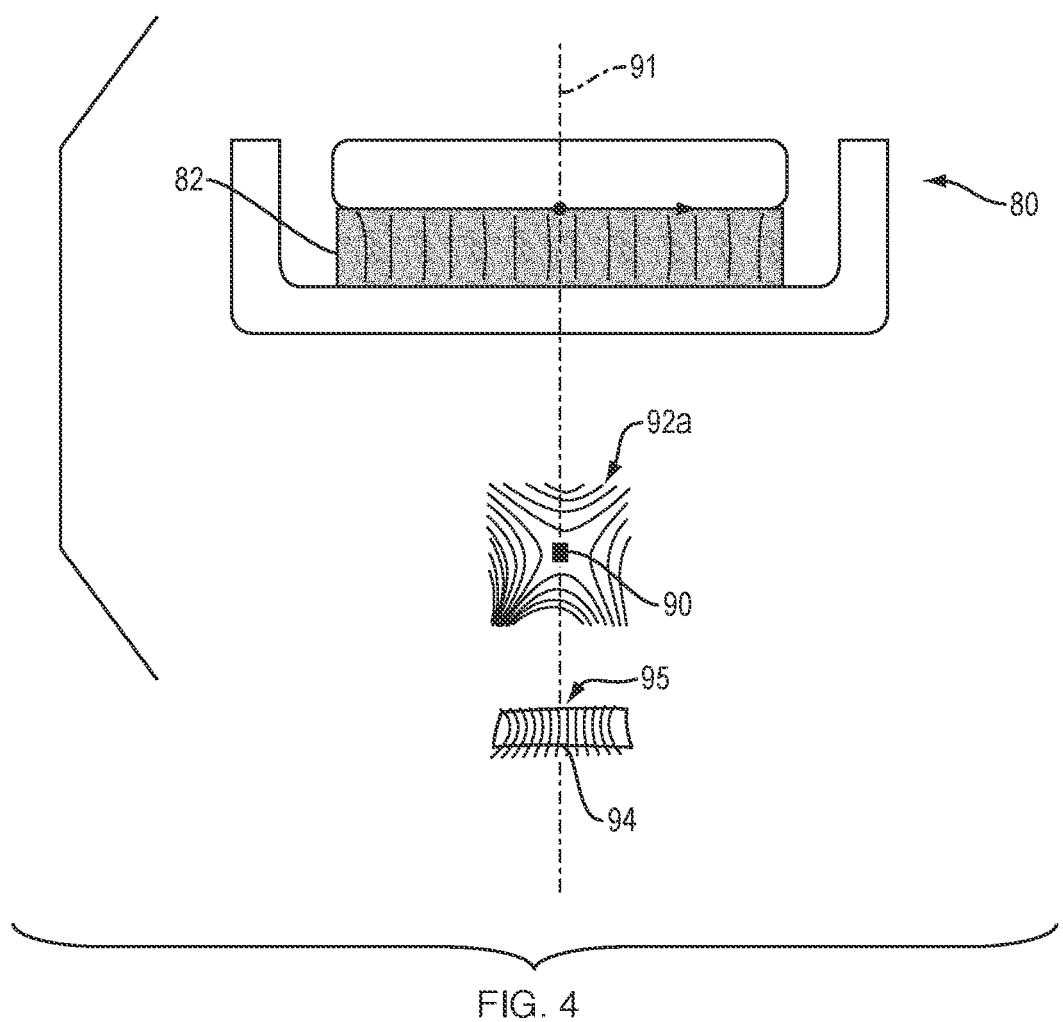
FIG. 4 is a view similar to that of FIG. 3 but including a nulling magnet.

FIGS. 3 and 4 illustrate aspects of an earphone. Earphone electro-acoustic transducer 80 comprises transducer magnet 82, and a magnetic structure 85 that comprises cup 86 and front member 84. Magnet 82 has a magnetic field, which is represented by the generally vertical field line representations 83. Magnetic fields and field line representations are well known in the art and so are not further described herein. The magnetic structure 85 spans a distance "d." Magnetometer 90 is spaced a distance "$d_1$" from magnetic structure 85 and is coaxial with magnet 82 along axis 91. The field from magnet 83 in the vicinity of magnetometer 90 is schematically represented by field lines 92. In the example, the field strength of the magnetic field from magnet 82 in the vicinity of magnetometer 90 is about 500 µT. Note that the field strength is unlikely to be the same in each of the three axes. The 500 µT value is simply representative of what the field strength may be in any one or more of the three axes. In contrast, the strength of the Earth's magnetic field is generally approximately 50 µT, or about $\frac{1}{10}^{th}$ of the field from example magnet 82. With a stray field such as this that overwhelms the field to be sensed, magnetometer 90 can be inaccurate because its limits may be exceeded such that the magnetometer is no longer functioning within its operational range. Accordingly, the heading direction sensing involving magnetometer 90 can be inaccurate. It should be understood that electro-acoustic magnet transducers can have varied shapes, sizes, locations, and field strengths, and that the illustrative values set forth in the examples are not limiting of the scope of this disclosure.

FIG. 4 illustrates schematically an effect of nulling magnet 94. Nulling magnet 94 is also located on axis 91. Nulling magnet 94 has a magnetic field, which is represented by the generally vertical field line representations 95. Nulling magnet 94 has a size, shape, magnetic orientation, magnetic field strength, and location relative to transducer 80 and magnetometer 90 such that its magnetic field is superimposed on the field from the transducer magnet 82 at the location of magnetometer 90. Because the transducer 80, magnetometer 90, and nulling magnet 94 are aligned along an axis, resulting in self-cancellation along two of three orthogonal sense axes, the nulling magnet 93 need only fully or partially null the transducer field in the remaining one orthogonal sense axis. In this non-limiting example, field nulling is indicated by field line representation 92$a$, showing a field null at magnetometer 90 (i.e., no field lines intersect magnetometer 90). Note that nulling could be accomplished with one or more separate nulling magnets. Also, the field that is nulled could be from the transducer magnet and/or from the parking or docking magnet. The nulling should be sufficient to reduce the stray magnetic field(s) to below the level where the magnetometer can operate in its normal operational range. The strength of stray fields that would bring a magnetometer out of its normal operational range are dependent on the particular magnetometer used.

It should be understood that the field does not need to be fully nulled by nulling magnet 94. Rather, as described above, the strength of the field needs to be reduced sufficiently such that the magnetometer can sense the Earth's magnetic field. The reduction in the transducer field at the magnetometer that needs to be accomplished with the nulling magnet will in part depend on the particular magnetometer used, as would be apparent to one skilled in the field.

Also, it should be understood that magnetic fields are three-dimensional, while FIGS. 3 and 4 are two-dimensional. Those skilled in the field will understand the extent to which the transducer magnet's field in three dimensions needs to be nulled in order for the sensing of the Earth's magnetic field to be accomplished with sufficient accuracy for the particular application of the Earth's magnetic field sensor, and can make an appropriate selection of the nulling magnet parameters described above to accomplish such results.

In one non-limiting example, transducer magnet 82 can be a generally cylindrical magnet with a diameter of about 8 mm, and cup 86 can have a diameter d of about 10 mm. In one non-limiting example, sensor 90 can be positioned less than about 10 mm from transducer 80.

Figure 5:
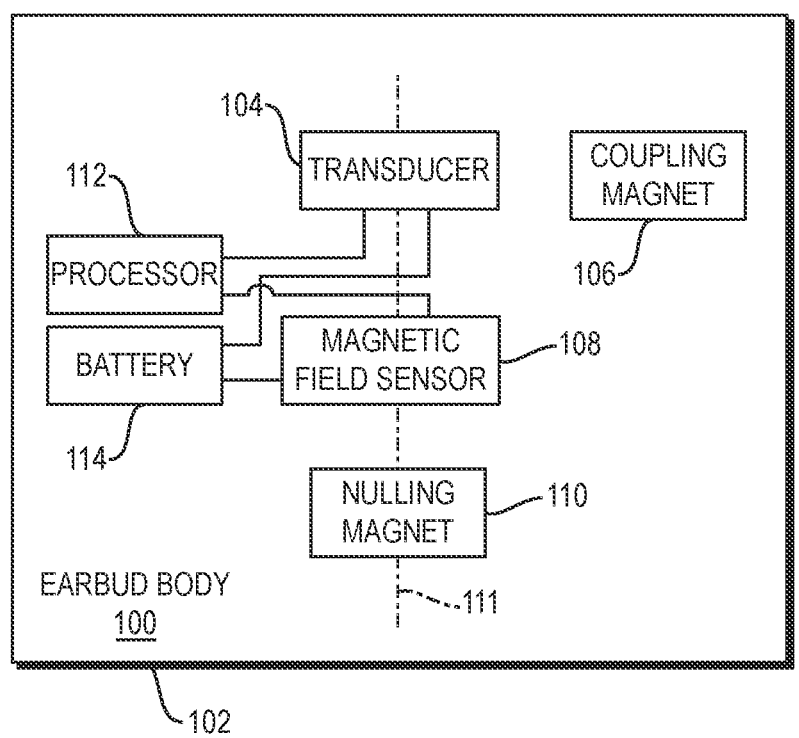
FIG. 5 is a schematic diagram of an earphone.

FIG. 5 is a schematic diagram of in-ear headphone 102, illustrating in part an additional coupling or parking magnet 106. The described components are located in earbud body 100. Battery 114 provides power to powered components. Processor 112 is used, in part, to drive transducer 104. Processor 112 is also used to determine the wearer's heading direction, in part using the output of magnetic field sensor 108. It should be understood that earphones will have more components and can have different components than those shown in FIG. 5. Some earphones include one or more magnets other than the transducer magnet. One such other magnet is represented in this non-limiting example by coupling or parking magnet 106. Coupling or parking magnet 106 can be used to couple or park earphone 102 to another structure. As one non-limiting example, magnet 106 can be used to "dock" an earbud to a battery charger. As another non-limiting example, magnet 106 can be used to park an earbud to another structure, such as a neckband or another earbud. Other uses of coupling and/or parking magnets are known in the field and are included within the scope of the present disclosure.

A docking and/or the clasping/coupling or parking magnet (e.g., magnet 106) has opposed first and second sides. The second side of the docking or parking magnet can be closer to the magnetic field sensor (or a different magnetic device) than is the first side. The flux of the magnetic field from the first side of the docking or parking magnet can have a greater magnitude than the flux of the magnetic field from its second side. In one non-limiting example the docking or parking magnet comprises a Halbach array. A Halbach array is a configuration of three or more permanent magnets, or three or more differently magnetized regions of a monolithic structure, arranged such that on one side of the Halbach array the magnetic fields reinforce and on another side of the Halbach array (typically, the opposite side) the fields cancel. One arrangement, which may be termed a discrete Halbach array, comprises three permanent magnets arranged side-by-side into a generally planar Halbach array. Another arrangement, which may be termed a continuous Halbach array, comprises three side-by-side regions of a monolithic structure where the regions are magnetized differently from one another. Note that either or both of the docking and parking or clasping magnet can be a Halbach array.

An advantage of a Halbach array is that its magnetic field is strong on one side and weak on the other side. If the side on which the field is strong is placed close to or against the inside surface of a wearable audio device housing and facing out, the field is better able to couple or park to another structure. At the same time, the field on the opposite side facing into the wearable audio device housing is weak and so it has less effect on the magnetometer and/or other magnetic device(s) as compared to a single magnet that has equal field strength on both sides, used as a parking or docking magnet. The effect of the Halbach array field at the magnetometer and/or other magnetic device(s) may be small enough that a separate nulling magnet may not be needed. In other words, the combined fields at the magnetometer and/or other magnetic device(s) from the Halbach array and the transducer magnet(s) may be small enough that the magnetometer and/or other magnetic device(s) can operate in its linear range without the need for an additional nulling magnetic field. Another advantage of a Halbach array is that it can achieve the same parking or docking field as a single magnet in less volume and less thickness than a single magnet. This frees up space in the earphone for other components or other functionalities. Another advantage is that the magnetic field on one side of the parking/docking magnet is stronger than the magnetic field of a comparably-sized single magnet.

All of the magnets in earbud body 100 of earphone 102 create magnetic fields that can adversely impact the accuracy of the sensing of the Earth's magnetic field by sensor 108, as described above. Nulling magnet 110 is included, and is coaxial with the magnet of transducer 104 and with magnetic field sensor 108, as indicated by axis 111. By proper sizing, orientation and placement of nulling magnet 110, the magnetic field from transducer 104 (and from additional magnet 106 when it is present) at sensor 108 can be reduced such that sensor 108 can detect the Earth's magnetic field, as described above.

One or more of the above described systems and methods, in various examples and combinations, may be used in a wide variety of audio systems, including wearable audio devices in various form factors. Unless specified otherwise, the term wearable audio device, as used in this document, includes headphones and various other types of personal audio devices such as head, shoulder or body-worn acoustic devices (e.g., audio eyeglasses or other head-mounted audio devices) that include one more acoustic transducers to receive and/or produce sound, with or without contacting the ears of a user. It should be noted that although specific implementations of speaker systems primarily serving the purpose of acoustically outputting audio are presented with some degree of detail, such presentations of specific implementations are intended to facilitate understanding through provisions of examples and should not be taken as limiting either the scope of disclosure or the scope of claim coverage.

Elements of FIG. 5 are shown and described as discrete elements in a block diagram. These may be implemented as one or more of analog circuitry or digital circuitry. Alternatively, or additionally, they may be implemented with one or more microprocessors executing software instructions. The software instructions can include digital signal processing instructions. Operations may be performed by analog circuitry or by a microprocessor executing software that performs the equivalent of the analog operation. Signal lines may be implemented as discrete analog or digital signal lines, as a discrete digital signal line with appropriate signal processing that is able to process separate signals, and/or as elements of a wireless communication system.

When processes are represented or implied in the block diagram, the steps may be performed by one element or a plurality of elements. The steps may be performed together or at different times. The elements that perform the activities may be physically the same or proximate one another, or may be physically separate. One element may perform the actions of more than one block. Audio signals may be encoded or not, and may be transmitted in either digital or analog form. Conventional audio signal processing equipment and operations are in some cases omitted from the drawing.

The example of FIG. 5 comprises a processor that is configured to use computer-implemented steps that will be apparent to those skilled in the art. For example, it should be understood by one of skill in the art that the computer-implemented steps may be stored as computer-executable instructions on a computer-readable medium such as, for example, floppy disks, hard disks, optical disks, Flash ROMS, nonvolatile ROM, and RAM. Furthermore, it should be understood by one of skill in the art that the computer-executable instructions may be executed on a variety of processors such as, for example, microprocessors, digital signal processors, gate arrays, etc. For ease of exposition, not every step or element of the systems and methods described above is described herein as part of a computer system, but those skilled in the art will recognize that each step or element may have a corresponding computer system or software component. Such computer system and/or software components are therefore enabled by describing their corresponding steps or elements (that is, their functionality), and are within the scope of the disclosure.

A number of implementations have been described. Nevertheless, it will be understood that additional modifications may be made without departing from the scope of the inventive concepts described herein, and, accordingly, other examples are within the scope of the following claims.

What is claimed is:

1. A wearable audio device, comprising:
   a multiple-axis magnetometer that is constructed and arranged to sense the Earth's magnetic field along at least a first and second mutually orthogonal sense axes;
   a first magnet that produces a first magnetic field along at least first and second mutually orthogonal first magnet axes; and
   a nulling magnet that produces a nulling magnetic field along at least a first and second mutually orthogonal nulling magnet axes, wherein the nulling magnet is configured to reduce an influence of the first magnetic field on the magnetometer;
   wherein the first nulling magnet axis, the first magnet axis, and the first sense axis are aligned.

2. The wearable audio device of claim 1, wherein the first nulling magnet axis, the first magnet axis, and the first sense axis are coaxial, and wherein the second nulling magnet axis, the second first magnet axis, and the second sense axis are coaxial.

3. The wearable audio device of claim 1, wherein the nulling magnet comprises a permanent magnet.

4. The wearable audio device of claim 1, wherein the first magnet comprises a transducer magnet of an electro-acoustic transducer that is adapted to create an audio output.

5. The wearable audio device of claim 4, further comprising a housing that is constructed and arranged to direct the audio output at the ear canal of the ear.

6. The wearable audio device of claim 5, wherein the nulling magnet is positioned in the housing such that the nulling magnetic field reduces the strength of the transducer magnetic field at the magnetometer.

7. The wearable audio device of claim 1, comprising an earbud with an earbud body, and wherein the magnetometer, the first magnet, and the nulling magnet are all located in the earbud body.

8. The wearable audio device of claim 1, wherein the magnetometer has a sensed magnetic field range where it operates linearly, and wherein the nulling magnetic field reduces the strength of the first magnetic field at the magnetometer such that the sensed magnetic field strength is in the sensed magnetic field range where the magnetometer operates linearly.

9. The wearable audio device of claim 1, wherein the first magnetic field has a direction along the first magnet axis, wherein the nulling magnetic field has an opposite direction along the first nulling magnet axis.

10. The wearable audio device of claim 1, wherein the first magnetic field has a direction along the first magnet axis, wherein the nulling magnetic field has the same direction along the first nulling magnet axis.

11. The wearable audio device of claim 1, wherein the magnetometer, the first magnet, and the nulling magnet are positioned along a common axis.

12. A wearable audio device, comprising:
    a housing that is configured to be located at least in part in an ear of a user;
    an electro-acoustic transducer in the housing for creating audio output that is provided to an ear canal of the user, the electro-acoustic transducer comprising a transducer magnet that produces a transducer magnetic field having a transducer magnetic field strength along at least a first transducer magnet axis; and:
    a magnetometer in the housing and that is constructed and arranged to sense the Earth's magnetic field along at least a first sense axis; and
    a nulling magnet in the housing and that is constructed and arranged to produce a nulling magnetic field along at least a first nulling magnet axis, wherein the nulling magnet is configured to reduce the strength of the transducer magnetic field along the first transducer magnet axis at the magnetometer;
    wherein the first transducer magnet axis, and-the first sense axis, and the first nulling magnet axis are aligned.

13. The wearable audio device of claim 12, wherein the magnetometer has a sensed magnetic field range where it operates linearly, and wherein the transducer magnetic field at the magnetometer has a strength such that the sensed magnetic field strength is in the sensed magnetic field range where the magnetometer operates linearly.

14. The wearable audio device of claim 12, wherein the magnetometer is constructed and. arranged to sense the Earth's magnetic field along at least first and second mutually orthogonal sense axes, wherein the transducer magnetic field has first and second mutually orthogonal first transducer axes, wherein the nulling magnetic field has first and second mutually orthogonal nulling magnet axes, and wherein the second nulling magnet axis, the second transducer magnet axis, and the second sense axis are aligned.

15. The wearable audio device of claim 12, wherein the transducer magnetic field has a direction along the transducer magnet axis, wherein the nulling magnetic field has an opposite direction along the first nulling magnet axis.

16. The wearable audio device of claim 12, wherein the transducer magnetic field has a direction along the transducer magnet axis, wherein the nulling magnetic field has the same direction along the first nulling magnet axis.

\* \* \* \* \*